United States Patent
Mangold et al.

(10) Patent No.: US 8,457,944 B2
(45) Date of Patent: Jun. 4, 2013

(54) METHOD AND DEVICE FOR DETERMINING REQUIREMENT PARAMETERS OF AT LEAST ONE PHYSICAL HARDWARE UNIT

(75) Inventors: Florian Mangold, Ismaning (DE); Harald Rölle, München (DE)

(73) Assignee: Siemens Aktiengesellschaft, Munich (DE)

( * ) Notice: Subject to any disclaimer, the term of this patent is extended or adjusted under 35 U.S.C. 154(b) by 174 days.

(21) Appl. No.: 13/058,254

(22) PCT Filed: Jul. 21, 2009

(86) PCT No.: PCT/EP2009/059342
§ 371 (c)(1), (2), (4) Date: Apr. 5, 2011

(87) PCT Pub. No.: WO2010/025994
PCT Pub. Date: Mar. 11, 2010

(65) Prior Publication Data
US 2011/0172985 A1   Jul. 14, 2011

(30) Foreign Application Priority Data
Sep. 5, 2008 (DE) .......................... 10 2008 046 096

(51) Int. Cl.
*G06F 9/44* (2006.01)
*G06F 13/10* (2006.01)
*G06F 13/12* (2006.01)

(52) U.S. Cl.
USPC .............................................. 703/21; 703/22

(58) Field of Classification Search
USPC ....................................... 703/21–22
See application file for complete search history.

(56) References Cited

U.S. PATENT DOCUMENTS

| | | | |
|---|---|---|---|
| 2008/0126071 A1* | 5/2008 | Faraboschi et al. | 703/22 |
| 2009/0171646 A1* | 7/2009 | Silbermintz et al. | 703/16 |
| 2010/0274550 A1* | 10/2010 | Chou et al. | 703/21 |

OTHER PUBLICATIONS

Watson, et al.; "Simulating L3 Caches in Real Time Using Hardware Accelerated Cache Simulation (HACS): a Case Study with SPECint 2000", Proceedings of the 14$^{th}$ Symposium on Computer Architecture and High Performance Computing, Piscataway, NJ, pp. 108-114, Jan. 1, 2002.
Prete C. et al.; "The Charm Tool for Tuning Embedded Systems", IEEE Micro, IEEE Service Center, Los Alamitos, vol. 17, No. 4, pp. 67-76, Jul. 7, 1997.

(Continued)

*Primary Examiner* — Eunhee Kim
(74) *Attorney, Agent, or Firm* — King & Spalding L.L.P.

(57) ABSTRACT

In a method and a device for determining requirement parameters of at least one physical hardware unit, the operating parameters of simulated, virtual hardware units are varied during the execution of a program flow on the virtual hardware units, for example via an interface device of a simulation device, in such a manner that requirement parameters of the execution of a program flow of at least one physical hardware unit can be identified. A method and a device are used for determining requirement parameters of at least one physical hardware unit. The method and the device are used to determine requirement parameters of software products of hardware components to be used. Requirement parameters are allowed to be identified systematically, using an operating system and eliminates the need for expensive, physical hardware components and for modifications to a physical computer system.

20 Claims, 3 Drawing Sheets

OTHER PUBLICATIONS

Poursepanj, A.; "The PowerPC Performance Modeling Methodology", Communications of the Association for Computing Machinery, vol. 37, No. 6, pp. 47-55, Jun. 1, 1994.

Bergqvist, M.; "Debugging Multicore Software Using Virtual Hardware", Power Architecture Conference, Paris, France; May 27, 2008-May 30, 2008, May 27, 2008.

German Office Action, German application No. 10 2008 046 096.6-53, 8 pages, May 7, 2010.

International PCT Search Report, PCT/EP2009/059342, 14 pages, Nov. 24, 2009.

* cited by examiner

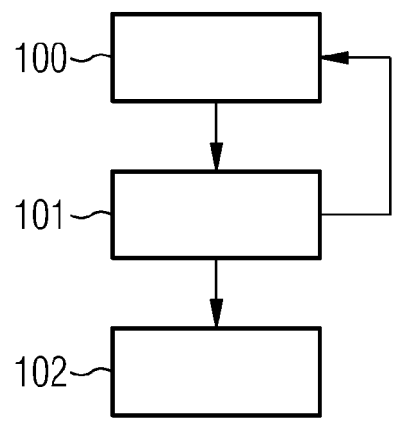
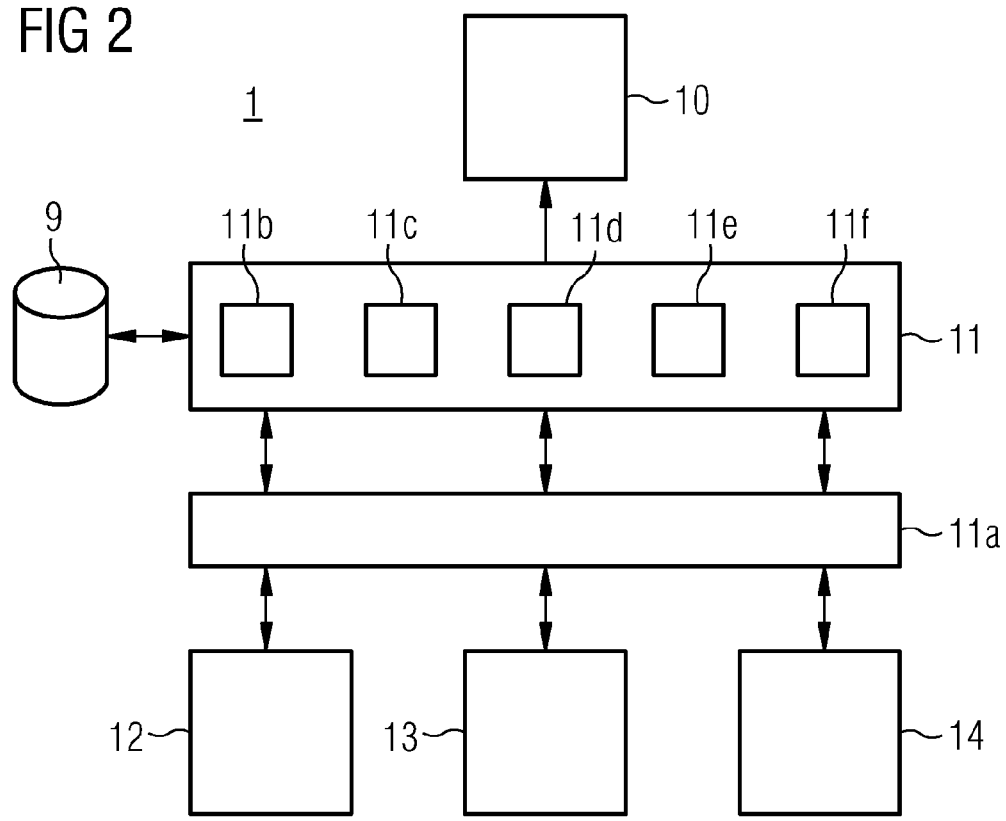

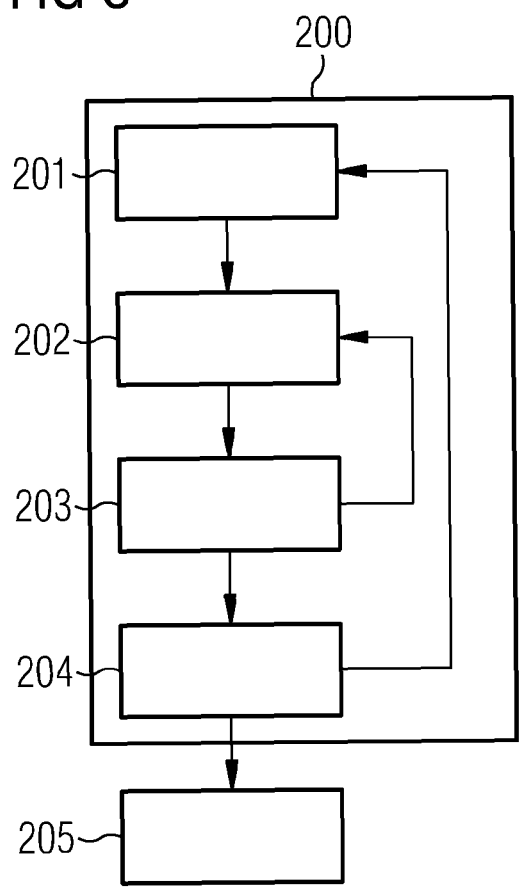

METHOD AND DEVICE FOR DETERMINING REQUIREMENT PARAMETERS OF AT LEAST ONE PHYSICAL HARDWARE UNIT

CROSS-REFERENCE TO RELATED APPLICATIONS

This application is a U.S. National Stage Application of International Application No. PCT/EP2009/059342 filed Jul. 21, 2009, which designates the United States of America, and claims priority to DE Application No. 10 2008 046 096.6 filed Sep. 5, 2008. The contents of which are hereby incorporated by reference in their entirety.

TECHNICAL FIELD

The present method relates to a method for determining requirement parameters for at least one physical hardware unit which ensure a well-defined program flow. The invention also relates to a computer system suitable for executing the method, and to a computer program product which initiates the execution of a corresponding method for determining requirement parameters.

BACKGROUND

When developing hardware- and also software-implemented systems, the compatibility of components, particularly their reusability, must be ensured where possible. To this end, software systems can be built in a modular design based on reusable software components, such as program modules, libraries or packages. Computer systems can be of modular design comprising hardware components, the compatibility of which is provided by standardized interfaces. For example, a plurality of software components are designed to be executable not only on individual computer systems but also on different computer systems without significant overhead. The reusability of software components, particularly on different computer systems, makes for an optimized cost-benefit ratio. Reusability is a motivating factor for the writing of high-quality software code that is sufficiently tested and well documented. Another advantageous aspect is the possibility of buying-in high-quality software code from external developers.

The approach of not having to design software components for a specific target system has gained acceptance with the widespread use of the higher-level programming languages. Software components are created which are translated by translators or more specifically compilers from the high-level language into the machine language of the respective target system. Prior to this, software components were implemented directly in the machine language for the target system in question. Since machine languages are less intuitively understandable to humans compared to high-level languages, this procedure involved more time and effort and was more prone to error. In particular, the software code could not be reused in most cases. Constantly implementing new software components likewise resulted in increased error proneness. For reasons of cost-effectiveness and reusability, software components should not be geared precisely to a target system and its precise technical details. An abstraction is consciously assumed in order to develop a software component more quickly, more efficiently and with fewer errors.

The compatibility of hardware components is a nonfunctional requirement which is desirable and necessary. On the other hand, technological progress means that there is a great diversity of hardware. Thus, different controllers with specific performance data can be used, for example. Similarly there are different storage media which differ considerably from one another in terms of price and performance. Hardware units usually have standard interfaces which are completely identical functionally. Due in particular to specific design and architecture patterns such as layering or proxies, a software engineer does not usually know which precise version of a hardware unit the software component will be accessing.

The above-mentioned aspects show that complete test coverage of a software component in respect of the hardware components used is only possible by investing a significant amount of time and effort. For example, hardware components on which the software component is to be implemented may be compatible in terms of the hardware-based interfaces, but the performance characteristics of the hardware components cannot satisfy the requirement parameters of the software component. In a particularly disadvantageous case this may result in an unserviceable software product in respect of the hardware components used. In this context a software product comprises at least one software component.

For example, in the case of software products, requirement parameters for the executing hardware components are specified which ensure a well-defined program flow. The program flow in this context encompasses the execution of a software component. Requirement parameters are determined, for example, by testing the software product on different physical computer systems. However, due to the increasing diversity of the computer systems, these requirement parameters can no longer be determined empirically, or only to an inadequate extent. In particular, dependencies between the operating parameters of the hardware units used can only be determined with enormous empirical overhead. If corresponding requirement parameters are available in full and are sufficiently precise, it is possible to make assessments concerning the operating parameters of the required hardware components. In particular, in terms of using the corresponding hardware units, costs can be saved by replacing a higher-performance but more expensive hardware unit by a cheaper hardware unit. The use of overly high-performance hardware units results in increased additional operating costs, in particular higher energy consumption or more specifically higher heat emission which has to be compensated by more intensive use of cooling components.

Due to the large range of functionally compatible hardware units, conventional techniques for determining requirement parameters can only test selected operating parameter profiles. Complete testing of all the operating parameter profiles for existing hardware components is virtually impossible due to the great multiplicity of possible combinations of hardware components for implementing a suitable computer system. Usually, precise requirements for the hardware components are only determined in a rudimentary and unsystematic fashion. Testing is therefore frequently not performed using a sufficient range of hardware components, but only on a small number of exemplary computer systems.

The use of mathematical models such as Markov chains or weighted Petri nets, for example, for determining requirement parameters necessitates the costly involvement of experts, can be susceptible to error and/or imprecise, which may prove to be particularly disadvantageous.

SUMMARY

According to various embodiments, an improved method for determining requirement parameters for at least one physical hardware unit can be provided.

According to an embodiment, in a method for determining requirement parameters for at least one physical hardware unit of a physical computer system with a plurality of hardware units, wherein a performance characteristic of the physical hardware unit resulting from operating parameters is to correspond to a predefined performance characteristic, a specified program flow is executed using a hardware unit with variable operating parameters which is simulated as a virtual hardware unit, and the requirement parameters ensuring a well-defined execution of the program flow using the physical hardware unit are determined as a function of a monitored performance characteristic of the virtual hardware unit.

According to a further embodiment, at least one selection of the following steps can be executed: —simulation of the physical hardware unit as a virtual hardware unit for embodying at least one part of a virtual computer system corresponding to the physical computer system; —assignment of at least one operating parameter profile to the virtual hardware unit, said profile comprising at least one operating parameter; —execution of the specified program flow using the virtual hardware unit; —varying of the operating parameter profile of the virtual hardware unit during the execution of the program flow; —monitoring of the performance characteristic of the virtual computer system during execution of the program flow; —determining the requirement parameters as a function of the monitored performance characteristic of the virtual computer system, wherein the requirement parameters correspond to operating parameters of the physical hardware unit which ensure a well-defined program flow. According to a further embodiment, the execution of the program flow, the varying of the operating parameter profile and/or the monitoring of the performance characteristic of the virtual computer system can be executed repeatedly in the same sequence for the purpose of determining the requirement parameters. According to a further embodiment, the execution of the program flow, the varying of the operating parameter profile and/or the monitoring of the performance characteristic of the virtual computer system can be executed at least to some extent concurrently for the purpose of determining the requirement parameters. According to a further embodiment, the program flow can be executed repeatedly and the operating parameter profile is varied such that the monitored performance characteristic of the virtual computer system during a program flow is lower than the monitored performance characteristic of the virtual computer system during a previously executed program flow. According to a further embodiment, the simulation of the physical hardware unit may include virtualization. According to a further embodiment, the simulation of the physical hardware unit may include emulation. According to a further embodiment, the varying of the operating parameter profile can be performed using an interface device of the virtual computer system. According to a further embodiment, the simulation of the physical hardware unit may encompass extending a hypervisor to include an interface device for varying the operating parameter profile of the virtual hardware unit. According to a further embodiment, in order to vary the operating parameter profile, at least one operating parameter can be varied as a function of at least one additional operating parameter. According to a further embodiment, the varying of an operating parameter profile of a first virtual hardware unit may take place as a function of an operating parameter profile of a second virtual hardware unit. According to a further embodiment, the varying of the operating parameter profile may take place such that the virtual hardware unit achieves a specified target performance characteristic. According to a further embodiment, the target performance characteristic of the virtual hardware unit camn be determined as a function of the program flow. According to a further embodiment, the varying of the operating parameter profile may take place as a function of the monitoring of the performance characteristic. According to a further embodiment, the monitoring of the performance characteristic may include acquiring, measuring, estimating, logging and/or storing performance characteristics. According to a further embodiment, the program flow may include a test routine, an algorithm, a software program, an instruction sequence and/or a program routine.

According to another embodiment, a computer system for determining requirement parameters for at least one physical hardware unit of a physical computer system may comprise a plurality of hardware units, with a control device for simulating the physical hardware unit as a virtual hardware unit, for assigning at least one operating parameter profile to the virtual hardware unit, for varying the operating parameter profile of the virtual hardware unit, for monitoring a performance characteristic and for determining the requirement parameters, said requirement parameters being those which ensure a well-defined execution of a specified program flow using the physical hardware unit.

According to a further embodiment of the computer system, the control device may comprise: at least one simulation device for simulating the physical hardware unit, at least one assignment device for assigning the operating parameter profile to the virtual hardware unit, at least one execution device for executing the predefined program flow using the virtual hardware unit, at least one variation device for varying the operating parameter profile of the virtual hardware unit during the program flow, at least one monitoring device for monitoring the performance characteristic and/or at least one requirement parameter determining device for determining the requirement parameters. According to a further embodiment of the computer system, the computer system may be embodied in such a way that a method as described above is executed. According to a further embodiment of the computer system, the simulation device is implemented as a hypervisor in which an interface device is provided for varying the operating parameter profile of the virtual hardware unit. According to a further embodiment of the computer system, the variation device may vary the operating parameter profile of the virtual hardware unit during execution of the program flow via the interface device.

According to a further embodiment of the computer system, the simulation device, the assignment device, the execution device, the variation device, the monitoring device and the requirement parameter determining device may be implemented at least in part as a computer program product.

According to yet another embodiment, a computer program product may execute a method as described above on a computer system as described above.

BRIEF DESCRIPTION OF THE DRAWINGS

The invention will now be explained in greater detail on the basis of exemplary implementations and with reference to the accompanying figures, in which:

FIG. 1 shows a flowchart of a variant of a method for determining requirement parameters;

FIG. 2 schematically illustrates a computer system for determining requirement parameters;

FIG. 3 shows a flowchart of a variant of a method for determining requirement parameters.

In the figures, unless stated otherwise, the same or functionally identical elements have been labeled with the same reference signs.

DETAILED DESCRIPTION

Figure 4:
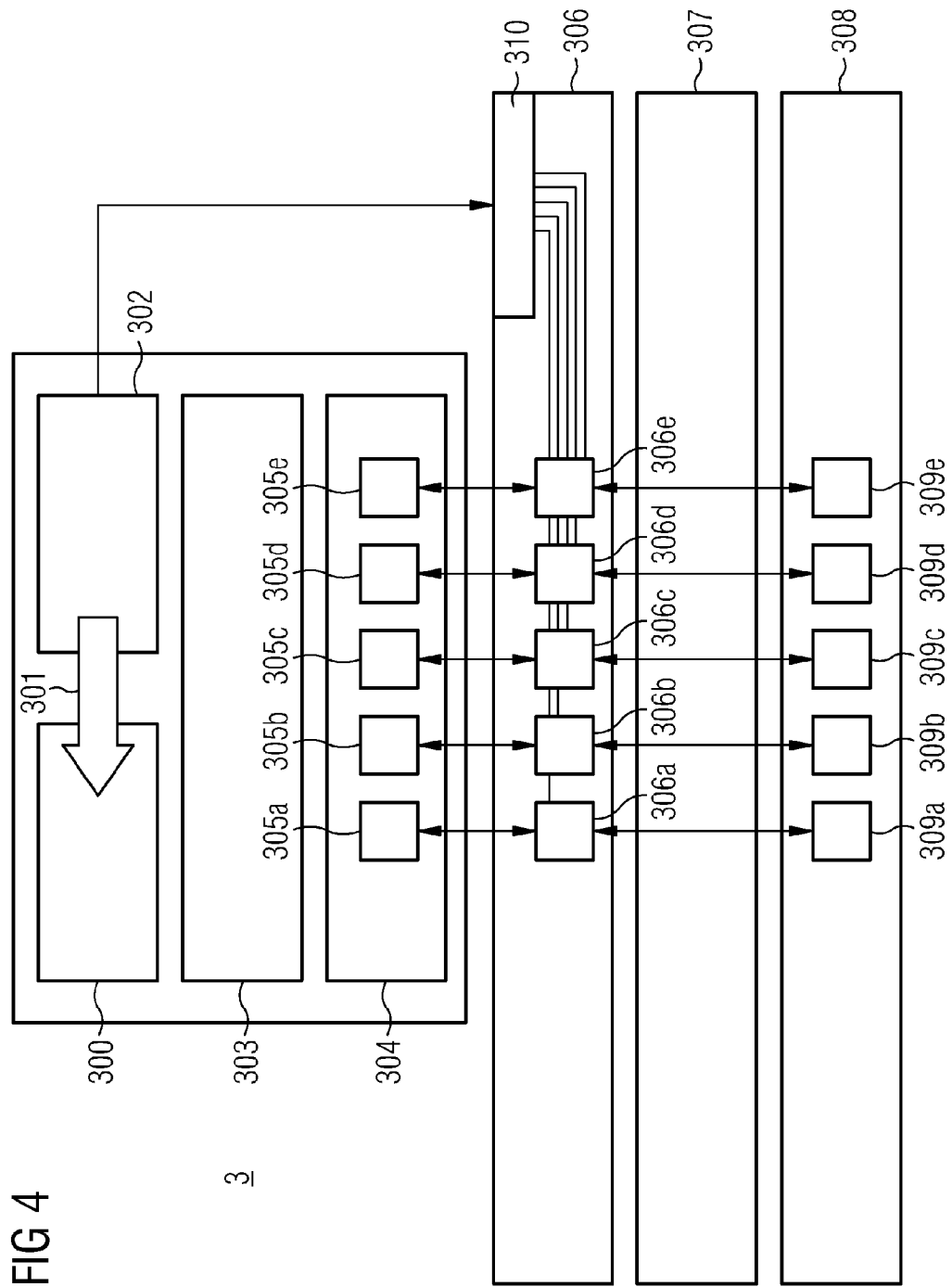
FIG. 4 schematically illustrates a computer system for determining requirement parameters.

Accordingly, a method for determining requirement parameters for at least one physical hardware unit of a physical computer system comprising a plurality of hardware units is provided. At least one physical hardware unit is simulated as a virtual hardware unit with varying operating parameters, thereby producing different performance characteristics. Performance characteristics of the physical hardware unit shall here correspond to predefined performance characteristics. For this purpose, a specified program flow is executed using a hardware unit simulated as a virtual hardware unit, with operating parameters of the virtual hardware unit being varied. Requirement parameters can be determined therefrom which correspond to the operating parameters of the physical hardware unit which ensure a well-defined program flow. The requirement parameters are determined as a function of a monitored performance characteristic of the virtual hardware unit.

Simulation of the physical hardware unit is understood to mean providing and operating virtual hardware units according to the functionality of a physical hardware unit.

Requirement parameters are those operating parameters of a hardware component that constitute a minimum requirement for the well-defined and error-free execution of a software component.

Operating parameters describe nonfunctional properties of a hardware component. Possible examples include processor clock rate, read or write access times of a memory, capacity of a storage device, revolutions of a hard disk or the bandwidth of a transmitting or receiving device. Operating parameters can be combined in operating parameter profiles in respect of a hardware component.

Performance characteristics in this context describe the nonfunctional behavior of the hardware unit or computer system resulting from the operating parameters as a function of the execution of the program flow. Performance characteristics can relate to physical and/or virtual hardware units or computer systems. A program flow can include, for example, a test routine, an algorithm, a software program, an instruction sequence and/or a program routine, for calculating an output or for providing a service.

A well-defined program flow is ensured if, for example, specified requirements, which may be termed "constraints", are fulfilled. Specified requirements can include nonfunctional requirements which may in turn affect functional requirements. For example, predefined response times may be required which, if they are not adhered to, may result in a timeout, a synchronization error or general malfunction, the avoidance of a synchronization error possibly being a functional requirement. Requirements may be defined in particular with respect to a real-time behavior of the specified program flow. If, for example, an image sequence is defined by the program flow, a real-time requirement is, for example, adherence to a minimum number of images per time unit. Another requirement with respect to the minimum number of images is, for example, a maximally equidistant insertion of the respective image in order to prevent delays or more specifically judder, e.g. in video information.

A physical computer system is therefore simulated as a virtual computer system, said virtual computer system in turn possibly consisting of a plurality of virtual hardware units. By means of the variable operating parameters of the virtual hardware units, diverse hardware units with in turn a diversity of operating parameter profiles can be monitored with respect to their execution of the predefined program flow. The advantage of this is that, by using the virtual hardware units, no physical modifications need to be carried out to the corresponding computer system. Another advantage is that operating parameters or rather operating parameter profiles of the hardware units used can be tested systematically, e.g. by a specified test program. The test program can initiate execution of the program flow with varying operating parameters and determination of the requirement parameters.

A physical computer system can be present e.g. as a computer, PC, data center, electronic data processing equipment, workstation and/or EDP system.

In a variant of the method, at least one selection of the following steps is carried out: simulating the physical hardware unit as a virtual hardware unit for embodying at least one part of the virtual computer system corresponding to the physical computer system; assigning at least one operating parameter profile to the virtual hardware unit, said profile including at least one operating parameter; executing the specified program flow using the virtual hardware unit; varying the operating parameter profile of the virtual hardware unit during execution of the program flow; monitoring the performance characteristic of the virtual computer system during execution of the program flow and determining the requirement parameters as a function of the monitored performance characteristic of the virtual computer system, said requirement parameters corresponding to those operating parameters of the physical hardware unit which ensure a well-defined program flow.

The simulation can also include emulation or virtualization. In this context, emulation can encompass the partial provision of functionality by the virtual hardware unit, wherein functionality not provided can be provided by a physical hardware unit. Virtualization in this context can encompass the complete provision of functionality by the virtual hardware unit. The simulated hardware unit is present virtually and is described and/or simulated e.g. by a software component and/or by a library. The physical hardware unit is physically, i.e. materially, present.

Assigning operating parameter profiles can include, for example, selecting suitable operating parameters and allocating suitable domains to the operating parameters. In this case operating parameters are suitably assigned to operating parameter profiles. The assignment suitability results from the respective application scenarios. For example, it may be suitable, according to a physical hardware unit present, to assign as far as possible identical operating parameters to the virtual hardware unit. Assignment can take place according to a physical hardware unit to be developed, wherein operating parameters of the physical hardware unit to be developed are assigned for test purposes to an operating parameter profile of a virtual hardware unit.

For example, it is possible for no identical operating parameter profile and/or functionality of a physical hardware unit to exist in respect of an operating parameter profile and/or a functionality of a virtual hardware unit. The hardware unit would then be purely virtual. There is then no physical hardware unit corresponding to the virtual hardware unit.

Virtual hardware units can be present e.g. as emulated hardware units or as virtualized hardware units. The program flow is executed using at least one virtual hardware unit, it being possible to vary the corresponding operating parameter profile of the virtual hardware unit e.g. according to a specified test program. This produces performance characteristics of the virtual computer system during execution of the program flow, said performance characteristics being monitored in the process. On the basis of the monitored performance characteristics of the virtual computer system, requirement parameters of the program flow can be determined for the physical hardware unit or physical hardware units. Requirement parameters in this context are those operating parameters of the physical hardware unit that ensure a well-defined program flow. Requirement parameters can also be determined as a function of operating parameter profiles of one or more virtual hardware units. In particular, dependences of different operating parameters of the physical hardware units can be determined systematically on the basis of the resulting performance characteristics.

During execution of the method, at least one selection of method steps can be performed iteratively or simultaneously. In addition, operating parameter profiles can be varied in program flows as a function of other operating parameter profiles. For example, an operating parameter which describes the capacity of a main memory can be varied as a function of an operating parameter which describes the capacity of a hard disk storage device. An advantageous result in this context would be, for example, that on the basis of monitored performance characteristics, expensive RAM can be replaced by comparatively less expensive hard disk storage in order to reduce costs. This would make sense, for example, if the slower access times of a hard disk compared to the main memory are sufficient to ensure the well-defined program flow. For example, a monitored performance characteristic can be a RAM access time.

In addition, operating parameter profiles can be varied such that monitored performance characteristics can be progressively reduced until a well-defined program flow is no longer ensured. The requirement parameters can therefore be determined from the monitored performance characteristics as a function of the respective operating parameter profile.

The operating parameter profile is varied, for example, via a corresponding interface device of the virtual computer system, or more specifically of the respective virtual hardware unit. For example, a hypervisor can have a suitable interface device. The varying of the operating parameter profiles can also take place as a function of the monitoring of the performance characteristic. If the measured performance characteristic is not at least in line with a predefined target performance characteristic, operating parameters affecting the performance characteristic can be varied accordingly.

Monitoring of the performance characteristic can include acquiring, measuring, estimating, logging and/or storing performance characteristics. For this purpose, for example, the program flow can be executed using a virtual hardware unit and performance characteristics resulting therefrom can be measured or estimated by e.g. statistical methods. Measuring in this case includes any kind of observation, comparison, digital or analog acquisition of performance characteristics. Estimating in this case includes any kind of projection, interpolation, extrapolation and/or inference or deduction. A requirement for estimation can be, for example, the presence of a predefined quantity of information reflecting empirical values of performance characteristics or already monitored performance characteristics.

According to a further embodiment, a computer system for determining requirement parameters for at least one physical hardware unit of a physical computer system comprises a plurality of hardware units. The computer system can have a control device which executes a method as described above. In addition, the computer system can have a simulation device, an assignment device, an execution device, a variation device and/or a requirement parameter determining device. The simulation device, the assignment device, the execution device, the variation device and/or the requirement parameter determining device can also be incorporated in the control device.

The simulation device can simulate the physical hardware unit as a virtual hardware unit and provide functionality of the physical hardware unit by means of the virtual hardware unit. The assignment device can assign corresponding operating parameter profiles to virtual hardware units.

The execution device can execute the specified program flow using the virtual hardware unit. The virtual hardware unit can be used, for example, in a passive or active manner. For example, a hardware unit can actively execute computing steps. Computing steps are e.g. basic arithmetic operations or value assignments to variables. Passive use includes e.g. logging of the performance characteristics. A computational unit can be implemented as a processor, microprocessor, computer, computer system, CPU (=Central Processing Unit), arithmetic logic unit (ALU) or circuit.

The variation device can vary the operating parameter profile of the virtual hardware unit during the program flow. The varying includes, for example, assigning a calculated, estimated, measured or user-entered value to the operating parameter. Said value can be calculated here as a function of monitored performance characteristics or other operating parameter profiles. For example, the operating parameters can be varied such that the monitored performance characteristics are reduced with each successive execution of the program flow. How the operating parameters are to be varied can furthermore be read from a data memory by the variation device.

The monitoring device can monitor performance characteristics of the virtual hardware unit which are used for executing the specified program flow. On the basis of the monitored performance characteristics, the requirement parameter determining device can determine the requirement parameters of the program flow for the hardware unit.

The simulation device, the assignment device, the execution device, the variation device, the monitoring device and the requirement parameter determining device can be present in physical form, but can also be virtually present as simulated hardware units, the functionality of the physical hardware unit being at least partially simulated. For example, above-mentioned devices can be implemented as part of a computer program.

According to yet another embodiment, a computer program product may initiate the execution of a method for determining requirement parameters for at least one physical hardware unit.

A method and a device for determining requirement parameters for at least one physical hardware unit are therefore described which enable extensive, precise and systematic testing of the execution of program flows on different target systems to be carried out. In addition, the requirement parameters for at least one physical hardware unit, or rather interdependencies of operating parameter profiles between a plurality of hardware units, can be determined as a function of a monitored performance characteristic.

FIG. 1 shows a flowchart of a variant of a method for determining requirement parameters. In this case, in a first step 100, a specified program flow is executed using a physical hardware unit simulated as a virtual hardware unit. In a subsequent step 101, an operating parameter profile of the virtual hardware unit is varied. In order to determine requirement parameters for the physical hardware unit empirically, it may be necessary to execute the steps 100 "Execution of a program flow" and 101 "Varying of the operating parameter profile" iteratively one after the other. This is indicated in FIG. 1 by an additional arrow connecting the steps 101 and 100, arrows being used here to indicate a possible execution sequence of the steps of the method.

Requirement parameters are those operating parameters of a hardware component that constitute a minimum requirement for executing a specified program flow. Operating parameters describe nonfunctional properties of a hardware unit. Typical examples include: processor clock rate, memory read or write access times, storage capacity, hard disk revolutions, bandwidth of a transmitting or receiving device. Operating parameters can be combined in operating parameter profiles in respect of a hardware component.

For example, a database management system requirement parameter for a hard disk is a required access time for a read operation. If the access time exceeds the requirement parameter, a timeout, for example, may occur, as a result of which the well-defined program flow of the database management system cannot be ensured. A program flow requirement parameter for a hard disk can be, for example, a minimum capacity of 500 GB, since generated data sets cannot otherwise be persistently stored.

The virtual hardware unit has performance characteristics which are produced as a function of the operating parameter profile and the program flow to be executed. In a step 102, program flow requirement parameters for the physical hardware unit are determined on the basis of a monitored performance characteristic.

FIG. 2 schematically illustrates a computer system 1 for determining requirement parameters of a specified program flow for at least one physical hardware unit. The computer system 1 has a control device 11 which communicates with simulation devices 12, 13 and 14 via an interface device 11*a*. Communication is indicated by double-headed arrows. For example, a block 12 is a simulation device for simulating a hard disk, a block 13 is a simulation device for simulating a removable media drive and a block 14 is a simulation device for simulating a network card. Simulation devices for simulating other physical hardware units are also conceivable in this case. Physical hardware units are in this case hardware components necessary for operating a computer system, said elements being able to be used in a passive or active manner.

The use of the virtual hardware unit can similarly include passive or active use. For example, a hardware unit can actively execute computing steps such as basic arithmetic operations or value assignments to variables. For example, assignment of the operating parameters to the operating parameter profile, simulation of the physical hardware units, execution of the program flow and/or determination of the requirement parameters can be initiated by a virtual hardware which is implemented as a computational unit. A computational unit can be implemented as a processor, microprocessor, computer, computer system, CPU, central processing unit, arithmetic logic unit and/or circuit. Passive use includes, for example, logging the performance characteristics and/or storing the operating parameters, the operating parameter profiles and/or the determined requirement parameters.

Performance characteristics in this context describe the nonfunctional behavior of the hardware unit or computer system resulting from the operating parameters as a function of the execution of the program flow. Performance characteristics may relate to physical and/or virtual hardware units or computer systems. For example, a performance characteristic is a processing time of a program flow by a virtual computer system resulting from the clock rate of a computational unit and/or the clock rate of a memory.

A program flow can include a test routine, an algorithm, a software program, an instruction sequence and/or a program routine, for calculating an output or providing a service. For example, a program flow can be a software component to be tested. For example, testing is to be performed for a database management system to ascertain which requirements in terms of response times must be fulfilled by a hard disk used. A response time is in this case a performance characteristic which can be affected by the operating parameter "number of revolutions" of a hard disk.

The computer system 1 described in FIG. 2 also comprises an output unit 10 which outputs the requirement parameters acquired by the control device 11. Said output unit can in this case be a printer, a display or a device for reproducing an audible signal. Alternatively to the output unit, a device for storing the requirement parameters can be provided. The device for storing the requirement parameters can be present as any kind of storage, for example as a hard disk, flash disk, CD, DVD, tape and/or removable media.

Simulation of the physical hardware unit is particularly advantageous if the physical hardware unit is in operation and operation cannot be interrupted. If the physical hardware unit is providing a service, for example, it can be simulated and requirement parameters for the physical hardware unit can be determined using the simulated virtual hardware unit. The offered service can therefore be provided without interrupting the physical hardware unit. In particular, it is possible to carry out the simulation of hardware units in a software-based manner. For this purpose, operating parameter profiles can be systematically and reproducibly varied without modifying the physical computer system, thereby making it possible to determine requirement parameters which are those operating parameters of the physical hardware unit that ensure a well-defined program flow.

To execute the steps described in FIG. 1, the control device 11 can comprise the following devices: an assignment device 11*b* for assigning the operating parameter profile to the virtual hardware unit, an execution device 11*c* for executing the predefined program flow using the virtual hardware unit, a variation device 11*d* for varying the operating parameter profile of the virtual hardware unit during the program flow, a monitoring device 11*e* for monitoring the performance characteristic, and a requirement parameter determining device 11*f* for determining the requirement parameters.

The assignment device 11*b* is used to assign an operating parameter profile to a virtual hardware unit provided by one of the simulation devices 12, 13 or 14. Suitable operating parameter profiles are read out by the assignment device 11*b* e.g. via the control device 11 from a data memory 9, provided as a function of a performance characteristic or provided as a function of a user input. A user in this context can be another device or a human user such as an administrator. Assignment can also include, for example, assigning a domain to an operating parameter. It can also include assigning operating parameters to operating parameter profiles. If the method is being executed for the first time, assignment can also include setting the operating parameters to initial values. For example, a clock rate of a processor simulated as a virtual processor by a simulation device can be initially assigned the value 2 GHz. Similarly, a simulated virtual main memory can be initially assigned 2 GB.

The execution device 11*c* executes a specified program flow using the virtual hardware unit. The program flow is therefore executed by the virtual hardware unit or by the virtual hardware unit in conjunction with the other virtual hardware units or, in the case of an emulation, using physical hardware units acting in conjunction with the virtual hardware unit. The use can include both active and passive use.

The variation device 11d varies the operating parameter profile of the respective virtual hardware unit. The varying includes, for example, assigning a calculated, estimated, measured or user-entered value to the operating parameter. Said value can be calculated here as a function of monitored performance characteristics or other operating parameter profiles. For example, the operating parameters can be varied such that the monitored performance characteristics are reduced with each successive execution of the program flow. How the operating parameters are to be varied can also be read out from a data memory 9 by the variation device 11d via the control device 11.

Monitoring of the performance characteristics is carried out by a monitoring device 11e. The monitoring device 11e monitors performance characteristics of a hardware unit, of a selection of hardware units or of the entire virtual computer system. From the monitored performance characteristics, the requirement parameter determining device 11f determines the requirement parameters of the program flow for the physical hardware unit. The requirement parameters are those operating parameters which ensure a well-defined program flow. In this context requirement parameters may relate to a physical hardware unit, a selection of physical hardware units or a physical computer system.

FIG. 3 shows a flowchart of a variant of a method for determining requirement parameters. In a first step 200, a physical hardware unit is simulated as a virtual hardware unit. The simulated virtual hardware unit is used in the steps 201, 202, 203 and 204, this being represented in FIG. 3 by a higher-order step 200 in the form of a block encompassing the steps 201, 202, 203 and 204. The step 200 includes the provision of a virtual hardware unit, which can take place e.g. by emulation or virtualization. For example, the step can be executed by a hypervisor. A hypervisor can be VMWare, for example. A hypervisor can incorporate a simulation device such as the simulation device 12 for simulating a hard disk as described in FIG. 2, the simulation device 13 for simulating a removable media drive and/or the simulation device 14 for simulating a network card.

Emulation can include the partial provision of functionality by the virtual hardware unit, wherein functionality not provided can be provided by a physical hardware unit. In an emulation, for example, read accesses to a first data record of a hard disk can be executed by a virtual hardware unit and write accesses to a second data record of the hard disk can be executed by a physical hardware unit. Virtualization in this case can describe the complete provision of functionality by the virtual hardware unit.

For example, when a physical hard disk is virtualized, the functionality of the physical hard disk, such as reading and writing of the data records, is executed by a virtual hard disk. A virtual hard disk is here a virtual hardware unit which provides the functionality of a physical hard disk by emulation or virtualization. Operating parameters of the virtual hardware unit such as storage capacity can in this case be provided using a physical hard disk. Similarly, a physical hard disk can also provide storage capacity for a plurality of virtual hard disks. Even in the case of a complete simulation of the functionality of the physical hard disk, such as write or read operations, a virtual hard disk therefore requires physical storage in order to be able to provide the operating parameter "storage capacity" corresponding to the available physical storage capacity.

In a virtual computer system, the number of virtual hardware units incorporated can be different from the number of physical hardware units of the simulated physical computer system. For example, in a virtual computer system a plurality of virtual hardware units can be present which are operated by a single physical hardware unit. Simulation of a physical hardware unit does not necessarily constitute a bijection between physical hardware units and virtual hardware units, but can also be an n:m mapping, where n and m are each natural numbers denoting the number of respective hardware units.

Simulating a physical hardware unit therefore includes providing and operating a virtual hardware unit in accordance with the functionality of the respective physical hardware unit.

In step 201, the virtual hardware unit is assigned an operating parameter profile. To this end, suitable operating parameters are selected from a set of operating parameters and assigned to operating parameter profiles which are in turn assigned to the virtual hardware unit. The assignment process also includes assigning domains to the operating parameters. If the method is being executed for the first time, assignment also includes assigning initial values to the operating parameters. In a step 202, a specified program flow is executed using the virtual hardware unit. In addition to the virtual hardware unit, other virtual or physical hardware units can also be involved in the execution. A program flow can here include a test routine, an algorithm, a software program, an instruction sequence and/or a program routine. For example, a program flow can be an Office program, a database management system, a video player, a control program or server service. In addition, program flows can be executed at the server end or client end and/or in a distributed manner.

For example, an Office program sets requirement parameters for the operating parameter "storage capacity" of a physical hard disk, since the program is installed locally on the hard disk. A well-defined program flow can be, for example, that the documents generated can be persistently stored at all times. For persistent storage, an Office program likewise sets requirement parameters for a physical hard disk. In respect of synchronizing documents with a remote document file system, the Office program requires a network connection which is provided, for example, via a physical network card. A requirement parameter to be met by the physical network card can then be a specified bandwidth, for example.

To determine requirement parameters for a physical main memory, the latter can be implemented as a virtual main memory in a step 200. The program flow of the Office program is then executed using the virtual main memory to which an operating parameter profile was assigned in a step 201.

The Office program is executed in a step 202, with a corresponding operating parameter profile specifying the storage capacity of the virtual main memory being varied in a step 203. For example, the capacity is successively reduced in a plurality of executions of the program flow by a test program which can modify the values assigned to the operating parameters via a suitable interface. The program flow is deemed to be no longer well-defined if, for example, considerable time delays result from exporting data to hard disk storage because of the reduced storage capacity of the virtual main memory. The delay is a performance characteristic of the virtual hardware unit used. If the delay exceeds a specified target performance characteristic, the well-defined program flow is no longer guaranteed.

The requirement parameters now describe those operating parameters of the main memory which fulfill the target performance characteristic when the Office program is executed using the virtual main memory. The use of the method according to various embodiments in the example described is advantageous because the Office program's requirement parameters for the physical main memory can be determined systematically and without modifying a physical computer system.

In step 203, operating parameter profiles are varied. In this case said varying comprises the assignment of changed values to the operating parameters. This can take place as a function of another operating parameter profile of a virtual hardware unit. In addition, operating parameters can be varied such that performance characteristics measured in one program flow are reduced in a subsequent program flow. For example, the clocking speed of a processor can be reduced in successive program flows so that the respective execution of the program flow takes longer than the previous execution of the program flow. Testing can thus be performed to ascertain at which clocking speed of the processor a timeout occurs. How the corresponding operating parameters are to be varied can be read out of a data memory, calculated, estimated or determined by user input.

In step 204, the performance characteristics resulting from the operating parameter profile and the program flow are monitored. A performance characteristic is e.g. an execution time required to execute a program flow using the virtual hardware unit. On the basis of the monitored performance characteristics, requirement parameters for the physical hardware unit are determined in step 205.

To determine requirement parameters for the physical hardware unit, the steps 200, 201, 202, 203, 204 and 205 can be executed in parallel, partly in parallel or iteratively in the same sequence. For example, step 203 in which the operating parameter profiles are varied can be carried out in parallel with step 202. Consequently, the operating parameters are varied during execution of the program flow using the virtual hardware unit.

Step 204 "Monitoring of the performance characteristic" can be carried out, for example, in parallel with step 202 "Execution of the program flow" and step 203 "Varying of the operating parameter profiles" in order thus to monitor the resulting performance characteristics. For example, a monitoring device 11e described in FIG. 2 can log performance characteristics such as execution times of program flows while a clocking speed of a simulated virtual processor is progressively reduced during execution of the program flow. For example, step 201 can also be carried out in parallel with the execution of the program flow in step 202. Possible execution sequences of the steps are indicated accordingly by arrows in FIG. 3.

FIG. 4 shows a schematic representation of a computer system 3 for determining requirement parameters. For this purpose a specified program flow 300 is tested by means of a test program 302 in an instance of a test 301 in respect of requirement parameters of the specified program flow for at least one physical hardware unit. Alternatively, the test program 302 can also be referred to as a "test driver". Both the program flow 300 and the test program 302 access a virtual computer system 304 via a guest operating system 303.

The virtual computer system comprises the virtual hardware units 305a, 305b, 305c, 305d and 305e. The virtual hardware units are provided by simulation devices 306a, 306b, 306c, 306d and 306e, respectively, which can be incorporated in a simulation system 306. The simulation devices 306a, 306b, 306c, 306d and 306e each simulate a physical hardware unit as a virtual hardware unit. The simulation devices 306a, 306b, 306c, 306d and 306e can have a performance limiter device which varies the operating parameter profile of the respective virtual hardware unit so as to produce a reducing performance characteristic each time the program flow is executed. A performance limiter device can correspond, for example, to a variation device described in FIG. 2. Performance limiter devices can have a performance limiting control device via which the interface device 310 is controlled. Physical hardware units can be present, for example, as a network card, as a removable media drive, as a hard disk, as a memory chip, as a processor or as a microprocessor.

The operating parameter profiles of the virtual hardware units can be assigned or rather varied by the test program 302 via an interface device 310. The test program 302 initiates the execution of the program flow 300 for each test 301 and monitors the performance characteristics resulting from the program flow 300 and the operating parameter profile of the virtual hardware unit. Performance characteristics are logged by the test program 302, and requirement parameters of the program flow 300 for the physical hardware unit are determined by the test program 302 as a function of the logged performance characteristics. This can be carried out, for example, as already described, by gradually reducing the performance characteristics and monitoring the execution of the program flow.

The simulation system 306 with its associated simulation devices 306a, 306b, 306c, 306d and 306e accesses the physical computer system 308 via the host operating system 307, this being indicated in FIG. 4 by bidirectional arrows. The guest operating system 303 and host operating system 307 can be present e.g. as a version of Windows or as a version of Linux. The physical computer system 308 comprises the physical hardware units 309a, 309b, 309c, 309d and 309e.

In an alternative embodiment variant, the simulation devices 306a, 306b, 306c, 306d and 306e simulate physical hardware devices which differ from the physical hardware units 309a, 309b, 309c, 309d and 309e in respect of the operating parameter profiles and the domains of the operating parameters and therefore simulate a physical computer system which does not correspond to the physical computer system 308.

A possible scenario for using the computer system 3 described in FIG. 4 is the testing of virtual hardware units (305a, 305b, 305c, 305d, 305e) of a virtual computer system 304 during execution of program flows 300, using a conventional hard disk and/or using a main memory. An advantageous result would be, for example, that on the basis of the monitored performance characteristics, expensive RAM can be replaced by comparatively less expensive hard disk storage in order to reduce costs. This makes sense, for example, if the slower access times of the hard disk compared to the main memory are sufficient to ensure the well-defined program flow 300. Swap data, for example, can therefore be stored to a large extent on the, compared to RAM, less expensive hard disk storage devices. Since the data is thus stored on the hard disk and not in main memory, savings on RAM can thereby be achieved.

Another example is the simulation of the use of flash disks. Unlike a conventional hard disk, with flash disks the performance characteristics write speed and read speed are asymmetrical. For example, writing to the flash disk takes longer than reading from the flash disk. The physical hardware unit hard disk and the physical hardware unit flash disk can be simulated using the computer system 3 described above. The program flow can now be executed a first time using a virtual hard disk and a second time using a virtual flash disk. By varying the operating parameter profiles of the virtual hardware unit hard disk and of the virtual hardware unit flash disk, their performance characteristics can now be monitored systematically during execution of the program flow. By means of the test, the replacement of a conventional hard disk by a flash disk can be simulated, for example. If reduced performance characteristics of physical hardware units of an existing physical computer system ensure a well-defined program flow, corresponding physical hardware units can be replaced by physical hardware units with reduced performance characteristics, thereby enabling a cost reduction to be achieved.

The advantage of this is that requirement parameters can be determined systematically, with the aid of an operating system (303), without using expensive physical hardware components (309a, 309b, 309c, 309d, 309e) and without modifications to a physical computer system (308).

The invention claimed is:

1. A method for determining requirement parameters for at least one physical hardware unit of a physical computer system with a plurality of hardware units, wherein a performance characteristic of the physical hardware unit resulting from operating parameters is to correspond to a predefined performance characteristic, the method comprising:

simulating the physical hardware unit as a virtual hardware unit for embodying at least one part of a virtual computer system corresponding to the physical computer system;

assigning at least one operating parameter profile to the virtual hardware unit, said profile comprising at least one operating parameter;

executing the specified program flow using the virtual hardware unit;

varying the operating parameter profile of the virtual hardware unit during the execution of the program flow, including varying an operating parameter of a first hardware component as a function of a corresponding operating parameter of a different, second hardware component;

monitoring the performance characteristic of the virtual computer system during execution of the program flow both before and after the varying of the operating parameter profile; and determining the requirement parameters as a function of the monitored performance characteristic of the virtual computer system both before and after the varying of the operating parameter profile, wherein the requirement parameters correspond to operating parameters of the physical hardware unit which ensure predefined performance results regarding the specified program flow.

2. The method according to claim 1, wherein at least one of the execution of the program flow, the varying of the operating parameter profile, and the monitoring of the performance characteristic of the virtual computer system are executed repeatedly in the same sequence for the purpose of determining the requirement parameters.

3. The method according to claim 1, wherein at least two of the steps of the execution of the program flow, the varying of the operating parameter profile, and the monitoring of the performance characteristic of the virtual computer system are executed at least partially concurrently for the purpose of determining the requirement parameters.

4. The method according to claim 1, wherein the program flow is executed repeatedly and the operating parameter profile is varied such that the monitored performance characteristic of the virtual computer system during a program flow is lower than the monitored performance characteristic of the virtual computer system during a previously executed program flow.

5. The method according to claim 1, wherein the simulation of the physical hardware unit includes virtualization.

6. The method according to claim 1, wherein the simulation of the physical hardware unit includes emulation.

7. The method according to claim 1, wherein the varying of the operating parameter profile is performed using an interface device of the virtual computer system.

8. The method according to claim 1, wherein the simulation of the physical hardware unit encompasses extending a hypervisor to include an interface device for varying the operating parameter profile of the virtual hardware unit.

9. The method according to claim 1, wherein the varying of the operating parameter profile takes place such that the virtual hardware unit achieves a specified target performance characteristic.

10. The method according to claim 9, wherein the target performance characteristic of the virtual hardware unit is determined as a function of the program flow.

11. The method according to claim 1, wherein the varying of the operating parameter profile takes place as a function of the monitoring of the performance characteristic.

12. The method according to claim 1, wherein the monitoring of the performance characteristic includes at least one of acquiring, measuring, estimating, logging and storing performance characteristics.

13. The method according to claim 1, wherein the program flow includes at least one of a test routine, an algorithm, a software program, an instruction sequence and a program routine.

14. A computer system for determining requirement parameters for at least one physical hardware unit of a physical computer system comprising a plurality of hardware units, comprising:

a control device for simulating the physical hardware unit as a virtual hardware unit, the control device comprising logic instructions stored in non-transitory computer-readable media and executable to:

simulate the physical hardware unit as a virtual hardware unit for embodying at least one part of a virtual computer system corresponding to the physical computer system;

assign at least one operating parameter profile to the virtual hardware unit, said profile comprising at least one operating parameter;

execute the specified program flow using the virtual hardware unit;

vary the operating parameter profile of the virtual hardware unit during the execution of the program flow, including varying an operating parameter of a first hardware component as a function of a corresponding operating parameter of a different, second hardware component;

monitor the performance characteristic of the virtual computer system during execution of the program flow both before and after the varying of the operating parameter profile; and determine the requirement parameters as a function of the monitored performance characteristic of the virtual computer system both before and after the varying of the operating parameter profile, wherein the requirement parameters correspond to operating parameters of the physical hardware unit which ensure predefined performance results regarding the specified program flow.

15. The computer system according to claim 14, wherein the control device comprises:

at least one simulation device for simulating the physical hardware unit, at least one assignment device for assigning the operating parameter profile to the virtual hardware unit, at least one execution device for executing the predefined program flow using the virtual hardware unit, at least one variation device for varying the operating parameter profile of the virtual hardware unit during the program flow, at least one monitoring device for monitoring the performance characteristic and/or at least one requirement parameter determining device for determining the requirement parameters.

16. The computer system according to claim 14, wherein the computer system is operable:
    to execute a specified program flow using a hardware unit with variable operating parameters which is simulated as a virtual hardware unit, and
    to determine the requirement parameters ensuring ensure the predefined performance results regarding the program flow using the physical hardware unit as a function of a monitored performance characteristic of the virtual hardware unit.

17. The computer system according to claim 15, wherein the simulation device is implemented as a hypervisor in which an interface device is provided for varying the operating parameter profile of the virtual hardware unit.

18. The computer system according to claim 15, wherein the variation device varies the operating parameter profile of the virtual hardware unit during execution of the program flow via the interface device.

19. The computer system according to claim 14, wherein the simulation device, the assignment device, the execution device, the variation device, the monitoring device and the requirement parameter determining device are implemented at least in part as a computer program product.

20. A computer program product comprising a non-transitory computer readable storage medium storing instructions which when executed by a computer system for determining requirement parameters for at least one physical hardware unit of a physical computer system perform the steps of:
    simulating the physical hardware unit as a virtual hardware unit for embodying at least one part of a virtual computer system corresponding to the physical computer system;
    assigning at least one operating parameter profile to the virtual hardware unit, said profile comprising at least one operating parameter;
    executing the specified program flow using the virtual hardware unit;
    varying the operating parameter profile of the virtual hardware unit during the execution of the program flow, including varying an operating parameter of a first hardware component as a function of a corresponding operating parameter of a different, second hardware component;
    monitoring the performance characteristic of the virtual computer system during execution of the program flow both before and after the varying of the operating parameter profile; and
    determining the requirement parameters as a function of the monitored performance characteristic of the virtual computer system both before and after the varying of the operating parameter profile, wherein the requirement parameters correspond to operating parameters of the physical hardware unit which ensure predefined performance results regarding the specified program flow;
    wherein the computer system comprises a plurality of hardware units, with a control device for simulating the physical hardware unit as a virtual hardware unit, for assigning at least one operating parameter profile to the virtual hardware unit, for varying the operating parameter profile of the virtual hardware unit, for monitoring a performance characteristic and for determining the requirement parameters, said requirement parameters being those which ensure the predefined performance results regarding the specified program flow using the physical hardware unit.

* * * * *